United States Patent [19]

Koh

[11] Patent Number: 5,138,164
[45] Date of Patent: Aug. 11, 1992

[54] INFRARED DETECTOR SUBARRAY WITH INTEGRAL OPTICAL FILTER

[75] Inventor: Wei H. Koh, Irvine, Calif.

[73] Assignee: Grumman Aerospace Corporation, Bethpage, N.Y.

[21] Appl. No.: 729,572

[22] Filed: Jul. 15, 1991

[51] Int. Cl.$^5$ .................... H01L 27/14; G02B 5/20
[52] U.S. Cl. ............................ 250/339; 250/349; 250/370.08
[58] Field of Search ............. 250/330, 332, 339, 349, 250/370.08

[56] References Cited

U.S. PATENT DOCUMENTS

| | | | |
|---|---|---|---|
| 4,618,763 | 10/1986 | Schmitz | 250/332 X |
| 4,659,931 | 4/1987 | Schmitz et al. | 250/332 X |
| 4,703,170 | 10/1987 | Schmitz | 250/211 |
| 4,792,672 | 12/1988 | Schmitz | 250/349 X |
| 4,794,092 | 12/1988 | Solomon | 437/51 |
| 5,038,041 | 8/1991 | Egan | 250/349 |
| 5,041,723 | 8/1991 | Ishida et al. | 250/339 |

OTHER PUBLICATIONS

Carlson et al., "Development of a Staring Mosaic Module", SPIE, vol. 197, Modern Utilization of Infrared Technology, 1979, pp. 2-8.

Primary Examiner—Constantine Hannaher
Assistant Examiner—Edward J. Glick
Attorney, Agent, or Firm—Stetina and Brunda

[57] ABSTRACT

An infrared detector subarray having an integral filter assembly is comprised of a plurality of stacked modules defining an infrared detector focal plane subarray; a filter plate sized and configured to correspond to the infrared detector subarray; and a plurality of supports disposed intermediate the filter plate and the detector subarray for attaching the filter plate to the subarray such that the filter plate is in close proximity to the detector subarray. Scattering and crossstalk are minimized by positioning the filter plate in close proximity to the detector subarray. The supports may comprise planar members having a thickness of less than approximately 0.003 inch such that they may be disposed intermediate adjacent modules. The filter plate may further comprise a plurality of parallel stripes, each parallel stripe transmitting infrared radiation of a different frequency than that transmitted by adjacent stripes such that a focal plane array comprised thereof may be sensitive to infrared radiation at a plurality of frequencies. Forming the filter as an integral part of the subarrays eliminates the need to fabricate a single filter having a diameter of two feet or more. The infrared detector subarray and integral filter assembly of the present invention provide for the fabrication of a filter which is easier to fabricate, has a higher fabrication yield, is lighter in weight, has improved mechanical stability, and facilitates more reliable testing.

16 Claims, 4 Drawing Sheets

INFRARED DETECTOR SUBARRAY WITH INTEGRAL OPTICAL FILTER

FIELD OF THE INVENTION

The present invention relates generally to infrared detector focal plane arrays and more particularly to an infrared detector focal plane subarray having an integral optical filter assembly.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. Infrared wavelengths extend from 0.75 micrometers to 1 millimeter. The function of an infrared detector is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range corresponding to the particular detection function of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared energy in one of several ways. Thermal detectors respond to infrared energy by absorbing that energy and thus causing an increase in temperature of the detecting material. The increased temperature in turn causes some other property of the material, such as resistivity, to change. By measuring this change the infrared radiation can be derived.

Photo-type detectors (e.g., photoconductive and photovoltaic detectors), absorb the infrared frequency energy directly into the electronic structure of the material, inducing an electronic transition which leads to a change in the electrical conductivity (photoconductors) or to the generation of an output voltage across the terminals of the detector (photovoltaic detectors). The precise change that is affected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and the development of highly sensitive electronic circuitry have advanced the performance of contemporary infrared detectors close to the ideal photon limit.

Current infrared detection systems incorporate arrays of large numbers of discrete, highly sensitive detector elements, in a focal plane array, the outputs of which are connected to sophisticated processing circuitry. By rapidly analyzing the pattern and sequence of detector element excitation, the processing circuitry can identify and monitor sources of infrared radiation.

Though the theoretical performance of such systems is satisfactory for many applications, it is difficult to actually construct structures that mate a million or more detector elements and associated circuitry in a reliable and practical manner. Consequently, practical applications for contemporary infrared focal plane arrays have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors in a focal plane array may, for example, contain 256 detectors on a side, or a total of 65,536 detectors, the size of each square detector being approximately 88.9 mm (0.0035 inches) on the side with 12.7 mm (0.0005 inches) spacing between detectors. Such a subarray would therefore be 2.64 cm (1.024 inches on a side. Thus, interconnection of such a subarray to processing circuitry requires a connective module with sufficient circuitry to connect each of the 65,536 detectors to processing circuitry within a square, a little more than 2.54 cm (one inch) on a side. Subarrays may, in turn, be joined to form a large focal plane array that connects to 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a signal processing module that performs at least a portion of the processing functions within the module, i.e. on integrated circuit chips disposed adjacent the detector focal plane, the signal from each detector need be transmitted only a short distance before processing. As a consequence of such on focal plane or up front signal processing, reductions in size, power and cost of the main processor may be achieved. Moreover, up front signal processing helps alleviate performance, reliability and economic problems associated with the construction of millions of closely spaced conductors connecting each detector element to the main signal processing network.

It is often desirable to construct a focal plane array sensitive to infrared radiation at a single or plurality of different frequencies. This may be done by disposing one or more optical filters in front of the detector elements. To provide a focal plane array having a plurality of frequency responses, the filter is typically divided into sections, i.e. stripes, each section transmitting a desired frequency band to dedicated detector elements. The focal plane arrays primary mirror may be toggled such that substantially the same image is alternately formed upon the different groups of detector elements located beneath the various filter sections or stripes. Each group of detector elements is thus responsive to one of the desired frequencies, i.e. disposed behind the appropriate optical filter section or stripe. Therefore, it is often desirable to mount filters in the optical path of the infrared detectors.

Prior art filters are commonly approximately 61.5 cm (2 feet) or more in diameter and approximately 0.64 cm (0.25 inch) thick. They must be large enough in diameter to cover the focal plane array and must be thick enough to avoid deformation due to mechanical vibration and thermal stress.

In order to obtain the desired frequency response, the stripes of the filter must be aligned such that infrared radiation passing therethrough falls upon the desired detector elements.

To minimize scattering and crosstalk, the filter must be located in close proximity to the detectors such that essentially all of the infrared radiation transmitted through a given portion of the filter is incident upon its associated detector element.

As such, although the prior art has recognized to a limited extent the problem of filtering infrared radiation prior to detection by focal plane arrays, the solutions have to date been ineffective in providing a satisfactory remedy.

SUMMARY OF THE INVENTION

The present invention comprises a plurality of stacked modules defining an infrared detector subarray; a filter plate sized and configured to correspond to the infrared detector focal plane subarray; and a plurality of supports disposed intermediate the filter plate and the infrared detector focal plane subarray for attaching the filter plate to the subarray such that the filter plate is in close proximity and substantially parallel to the detector elements. Scattering and crosstalk are minimized by positioning the filter plate in close proximity to the detector subarray. The supports may comprise planar members having a thickness of less than approximately 0.1 mm (0.003 inch) such that they may be disposed intermediate adjacent modules without affecting the spacing thereof. The modules may have a thickness of approximately 0.1 cm (0.040 inch), for example.

The filter plate may further comprise an optical thin film coating to form plurality of parallel stripes, each parallel stripe transmitting infrared radiation of a different frequency than that transmitted by adjacent stripes such that a focal plane array comprised thereof may be sensitive to infrared radiation at a plurality of frequencies. The filter plate is preferably single substrate coated within an optical thin film configured in stripes such that adjacent stripes transmit different frequencies. The infrared detector elements disposed behind a given stripe are thus sensitive to the frequency of infrared radiation transmitted through that stripe. The pattern of stripes is repeated across the surface of the filter such that a substantially complete image may be formed thereupon through toggling of the focal plane's primary mirror. The focal plane array's primary mirror may thus be toggled to shift an image among the various groups of stripes to provide multiple frequency imaging.

Forming the filter as an integral part of each focal plane subarray eliminates the need to fabricate a single focal plane array filter having a diameter of 60 cm (two feet) or more. The infrared detector subarray and integral filter assembly of the present invention provide for the construction of a filter which is easier to fabricate, has a higher fabrication yield, is lighter in weight, has improved mechanical stability, and facilitates more reliable testing.

Prior art filters must be aligned to the focal plane array during final assembly. This assures that infrared radiation transmitted through any particular portion of the filter will be incident upon the desired detector elements. This is particularly important for filters comprised of a plurality of sections or stripes which transmit infrared radiation at different frequencies. Filter alignment during final assembly of the focal plane array is eliminated by the present invention since each subarray filter plate is fabricated such that it is permanently aligned to the detectors of its associated subarray. Thus, the cost of focal plane array assembly is reduced.

The weight of the focal plane array is reduced since the integral subassembly filters can be fabricated substantially thinner than the single prior art focal plane filter. This is possible since each filter of the present invention is supported by its own associated subarray. The prior art large diameter single filter plate must be supported by mounting hardware about its periphery. For example, integrated subarray filters can be fabricated to have a thickness of less than approximately 0.25 cm (0.1 inch), preferably approximately 0.1 cm (0.04 inch), whereas prior art focal plane filters typically must be at least 0.635 cm (0.25 inch) thick to provide the required mechanical stability. Additionally, mounting brackets and alignment hardware are eliminated by the integral subassembly filter. Thus, the weight of the completed focal plane assembly is reduced substantially.

Mechanical stability is improved since the large diameter prior art filter plate is more prone to deflection and bending when subjected to mechanical vibration. Thus, tight tolerances are required for the gap between the detectors and the filters. It is desirable to maintain the gap distance as small as possible, i.e. approximately 0.127 mm (0.005 inch), to mitigate scattering and crosstalk. It is difficult to maintain tight tolerances since a large-diameter filter can only be supported at its edges. However, the integral subarray filter of the present invention is supported by spacers extending from the subarray stack which substantially reduce the potential deflection both in the x-y plane, i.e. parallel to the plane of the detector array, and in the z-direction which affects the gap width between the filters and the detectors.

More reliable test results are achieved with the integral subarray filter of the present invention than with prior art large diameter single filter plates. This is because an assembled infrared detector subarray with integral optical filter of the present invention may be tested with the filter already in place whereas in the prior art a single large diameter filter plate must be temporarily installed and aligned for testing. By eliminating this temporary installation and alignment, the potential for error during such installation and alignment is eliminated. Additionally, with the prior art large diameter single plate filters many problems may be discovered only after the focal plane and its filter are finally assembled and tested. Correcting problems discovered after final assembly may require disassembly of the focal plane array and filter. Thus, improving the reliability of testing the focal plane array may substantially reduce the cost of its fabrication.

Lower fabrication costs are also achieved since damage occurring, even to a small area, of a prior art large diameter filter plate requires that the entire filter be replaced whereas with the integral subarray filters of the present invention only those filters actually requiring repair must be replaced.

These, as well as other advantages of the present invention will be more apparent from the following description and drawings. It is understood that changes

DETAILED DESCRIPTION OF THE PREFERRED EMBODIMENT

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiment. It is to be understood, however, that the same or equivalent functions and sequences may be accomplished by different embodiments that are also intended to be encompassed within the spirit and scope of the invention.

The infrared detector subarray having an integral optical filter of the present invention is illustrated in FIGS. 5-10 which depict a presently preferred embodiment of the invention. FIGS. 1-4 illustrate the concept of toggling and show how prior art infrared detector modules are assembled into a focal plane array.

Figure 1:
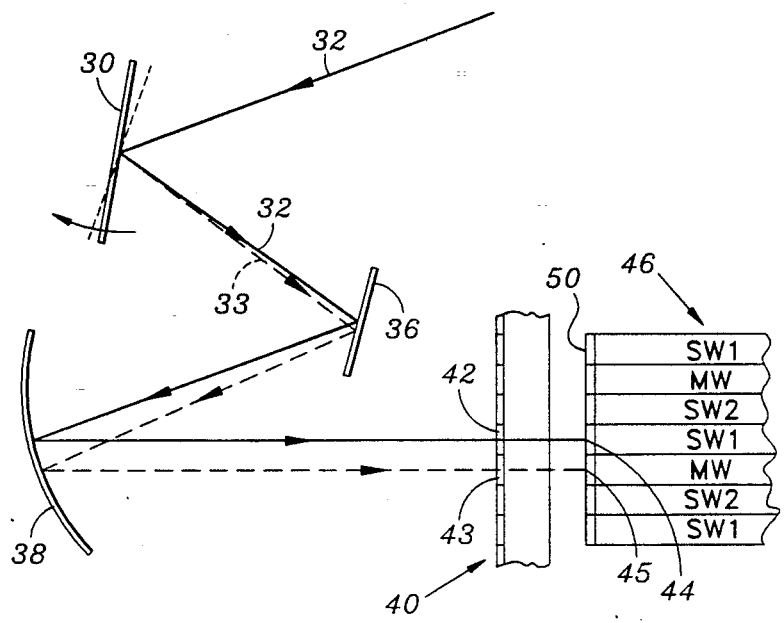
FIG. 1 is a schematic representation of a portion of a prior art focal plane subassembly and a large diameter filter plate illustrating how toggling of the primary mirror shifts an incoming ray of infrared radiation between two different filter stripes and consequently between different detector elements.

Referring now to FIG. 1, an incoming ray of infrared radiation first strikes primary mirror 30. First reflected ray 32 is then incident upon secondary mirror 36 and tertiary mirror 38 from which it is reflected through stripe 42 of large diameter filter plate 40 to a first infrared detector 44 attached to one of the modules 46. Toggling of the primary mirror 30 in the direction indicated by the arrow causes second reflected ray 33 to travel along a different path and pass through a different stripe 43 of the filter plate 40 to be incident upon infrared detector 45. Thus, toggling of the primary mirror 30 may be utilized to shift the image from a given set of detector elements to a different set of detector elements. By placing a filter plate 40 having stripes of areas which transmit infrared radiation at different frequencies in the path of the infrared radiation, the image can be shifted such that it is incident upon detector elements whose outputs will then correspond to different portions of the infrared spectrum. Thus, infrared images of two or more different frequencies may be detected.

The stack of modules 46 is comprised of alternating layers of individual modules which output signals representative of three different portions of the infrared spectrum. The SW1 and SW2 modules output signals representative of two different frequencies of short wavelength infrared radiation. The MW modules output signals representative of medium wavelength infrared radiation. The frequencies to which the modules are sensitive are determined by the stripes 42 of the filter plate 40 to which they correspond, i.e. are disposed behind. The thickness of each module depends upon how many rows of detectors are formed thereon. Thicknesses of approximately 0.10 cm (0.040 inch) are typical.

It must be appreciated that consistent spacing between adjacent modules must be maintained to assure that each portion of an image moves to the appropriate location, i.e. detector element, during toggling. Nonuniform spacing would result in portions of an image, not being focused upon the desired detector elements. Thus, it is necessary to maintain the spacing of the modules and therefore the detector elements, when attaching structures thereto, such as those used to support a filter assembly.

Figure 2:
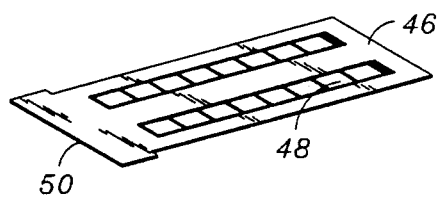
FIG. 2 is a perspective view of an individual prior art module prior to stacking.

Referring now to FIG. 2, a single prior art infrared detector module is illustrated. Signal conditioning circuits or chips 48 may be disposed upon or within the module 46 to facilitate electronic filtering, noise rejection, analog to digital conversion, and the like. One or more rows of detector elements 50 are formed upon one edge of the module such that when stacked, the detector elements may be formed into a planar array.

Figure 3:
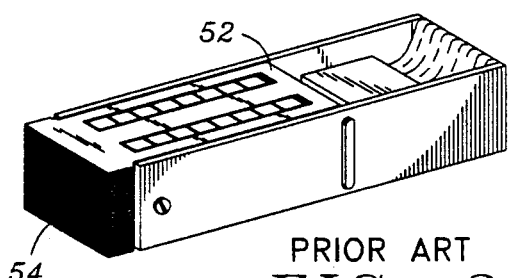
FIG. 3 is a perspective view of a plurality of modules stacked to form a prior art focal plane subarray.

Referring now to FIG. 3, an infrared detector subarray 52 having detector elements 50 formed into a planar array 54 is illustrated. In order to form the modules 46 (shown in FIG. 2) into a subarray 52, the individual modules 46 must be precisely stacked such that the detector elements 50 are aligned.

The construction of infrared detector modules and subarrays is described in further detail U.S. Pat. No 4,659,931 issued on Apr. 21, 1987 to Schmitz, et al. and assigned to the common assignee Grumman Aerospace Corporation, Bethpage, N.Y., the entire disclosure of which is expressly incorporated by reference.

Figure 4:
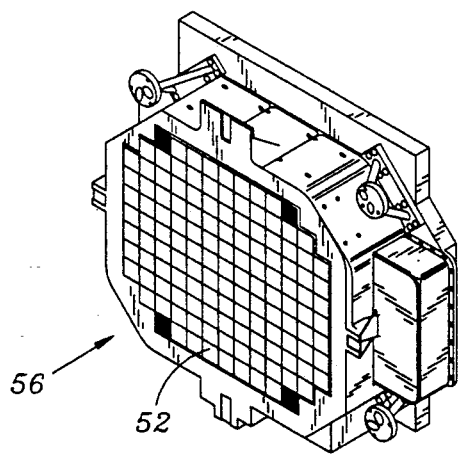
FIG. 4 is a perspective view of a plurality of focal plane subarrays assembled to form a prior art focal plane array.

Referring now to FIG. 4, a focal plane array 56 comprised of a plurality of subarrays 52 is illustrated. In the prior art the focal plane array 56 must be assembled prior to attaching and aligning the filter plate 40 (shown in FIG. 1) thereto.

Figure 5:
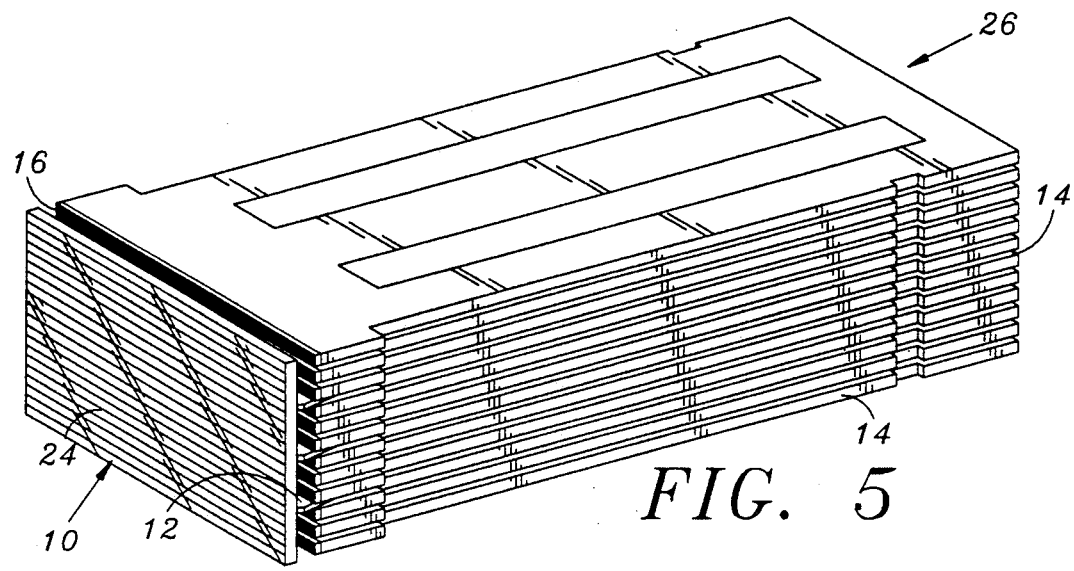
FIG. 5 is a perspective view of a focal plane subarray having an integral filter of the present invention.

Referring now to FIG. 5, the infrared detector subarray having an integral optical filter of the present invention is generally comprised of a plurality of optical coating filter stripes 24 defining a filter plate 10 disposed parallel and adjacent to a corresponding plurality of detector arrays 16 which are attached to a corresponding plurality of modules 14 formed into a focal plane subarray 26. Each stripe 24 transmits infrared radiation of a frequency different from that transmitted by adjacent stripes. Thus, two or more frequency bands may be transmitted to the associated detector elements. Alternatively, the optical filter may be comprised of regions which transmit infrared radiation of different frequencies, the regions being formed in an alternating square, i.e. checkerboard fashion or other similar geometric configuration wherein adjacent filters transmit infrared radiation of different frequencies. Spacers or supports 12 attach the filter plate 10 to the subarray 26. Each support 12 may be disposed intermediate adjacent modules 14 such that it is captured therebetween.

In the preferred embodiment of the present invention filter plate 10 is comprised of a plurality of stripes 24, each stripe transmitting infrared radiation of a frequency different from that transmitted by adjacent stripes 24. Those skilled in the art will recognize that various configurations of filter sections are possible such that different regions of the filter plate 10 transmit infrared radiation of different frequencies. Indeed, the filter plate 10 could be of comprised of a single section such that all detectors 16 receive infrared radiation of a single frequency or band of frequencies.

Figure 6:
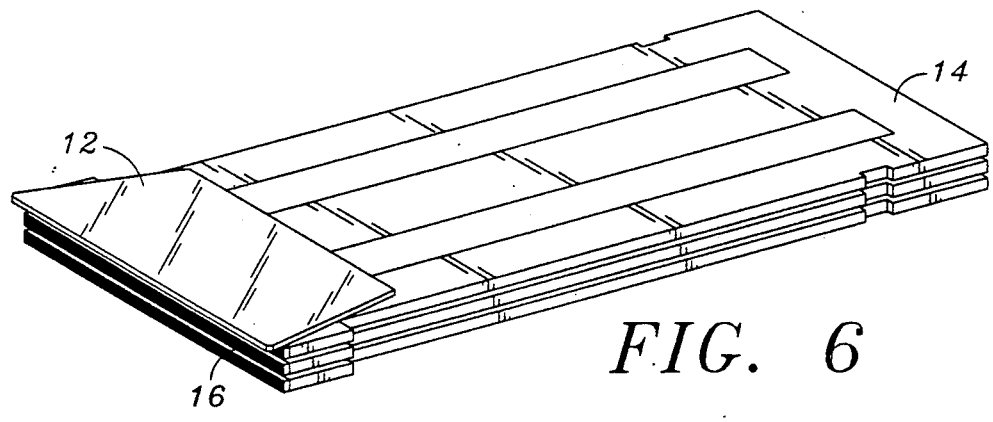
FIG. 6 is an enlarged view of a stack of three modules having a spacer attached thereto.
Figure 7:
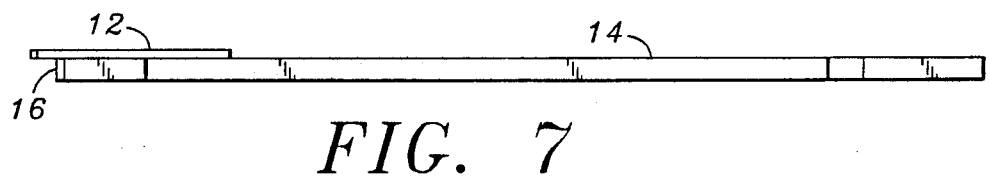
FIG. 7 is a side elevation view of the spacer and uppermost module of FIG. 6.

Referring now to FIGS. 6 and 7, a suitable adhesive, such as an adhesive commonly used to bond adjacent modules together, may be utilized to bond the support 12 to the adjacent modules 14. The supports 12 are aligned such that their forward edges define a common plane to which the filter plate 10 may be bonded. Each support 12 is sufficiently thin, preferable less than 0.1 mm (0.003 inch), to permit the desired spacing of the modules 14.

Figure 8:
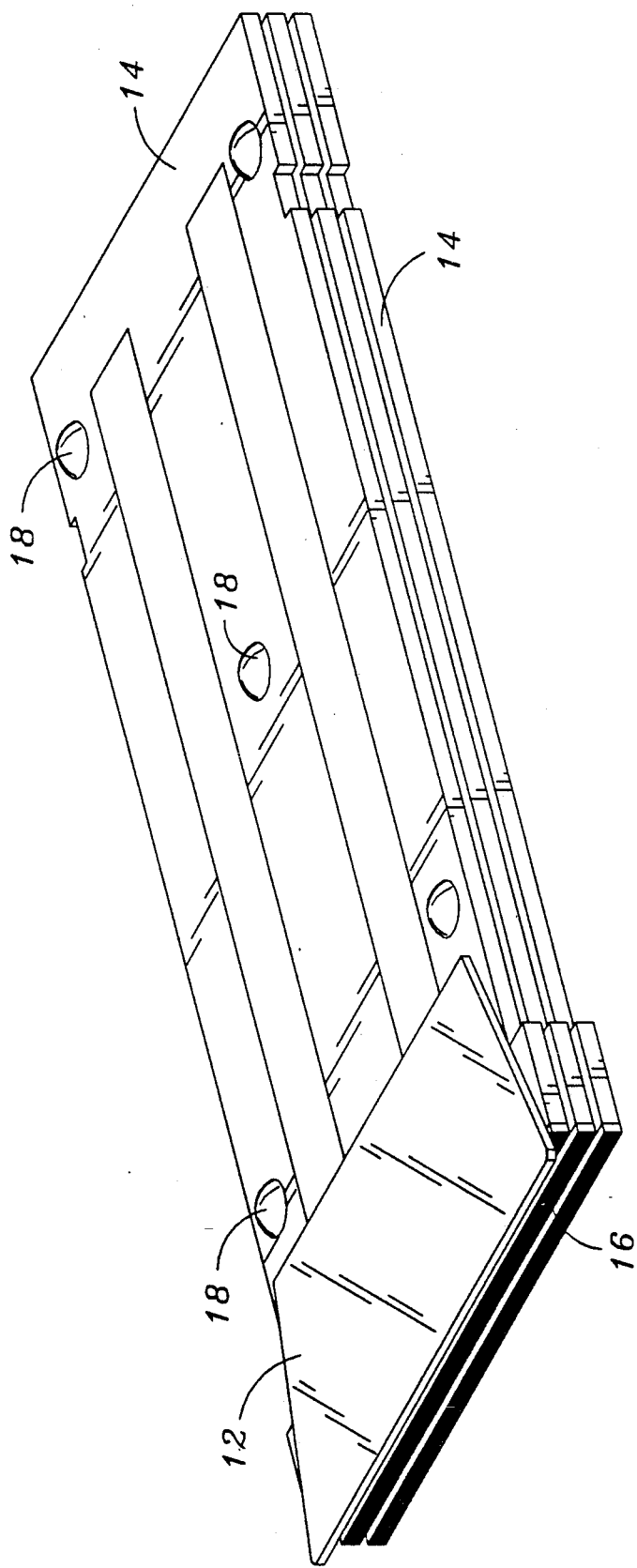
FIG. 8 is an enlarged perspective view of the modules of FIG. 6 additionally showing conformal shims disposed upon the uppermost module thereof.

Referring now to FIG. 8, conformal shims 18 are shown disposed at various locations upon the upper surface of a module 14 such that another module 14 may be disposed thereupon and attached thereto. The precise locations of the conformal shims 18 are not considered crucial. The conformal shims 18 should be located such that they provide adequate and balanced support and bonding to adjacent modules 14. The conformal shims 18 are comprised of a thixotropic paste material which is suitable for bonding adjacent modules 14 together and which remains pliant or conformable prior to the curing thereof. Those skilled in the art will recognize that various adhesives are suitable.

Thus, a stack of modules 14 may be formed to define a focal plane subarray 26. A fixture may be used to facilitate the precision stacking of the modules 14. The fixture may also be used to apply pressure to the stack of modules 14 such that the desired spacing between modules 14 is maintained during the curing process. Heat may be applied to the stacked modules to facilitate curing.

Figure 9:
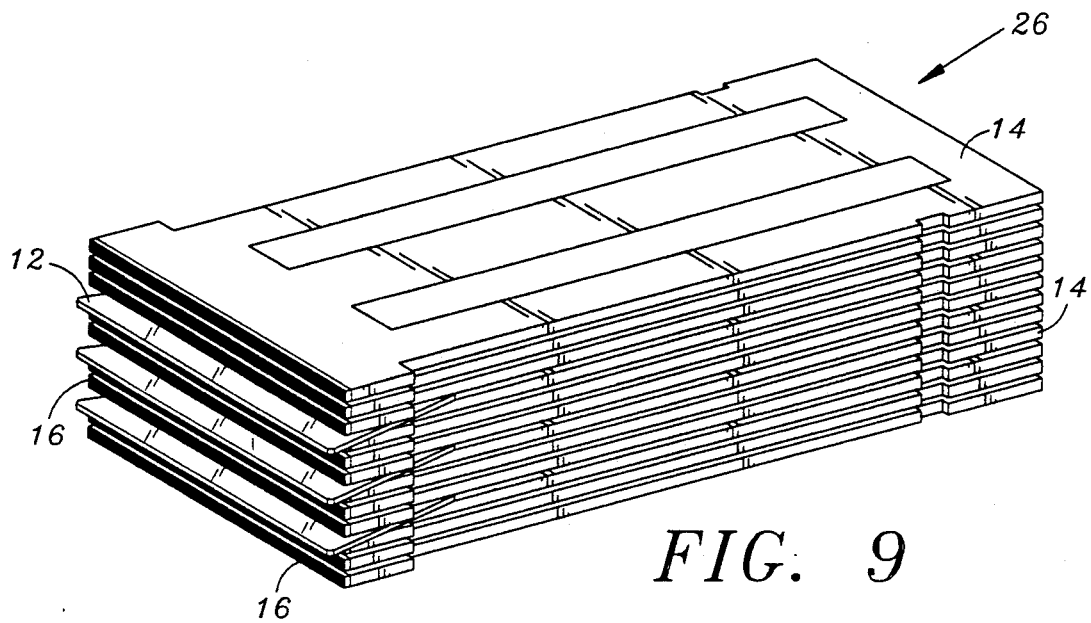
FIG. 9 is a perspective view of a plurality of modules having a spacer disposed intermediate selected adjacent modules.
Figure 10:
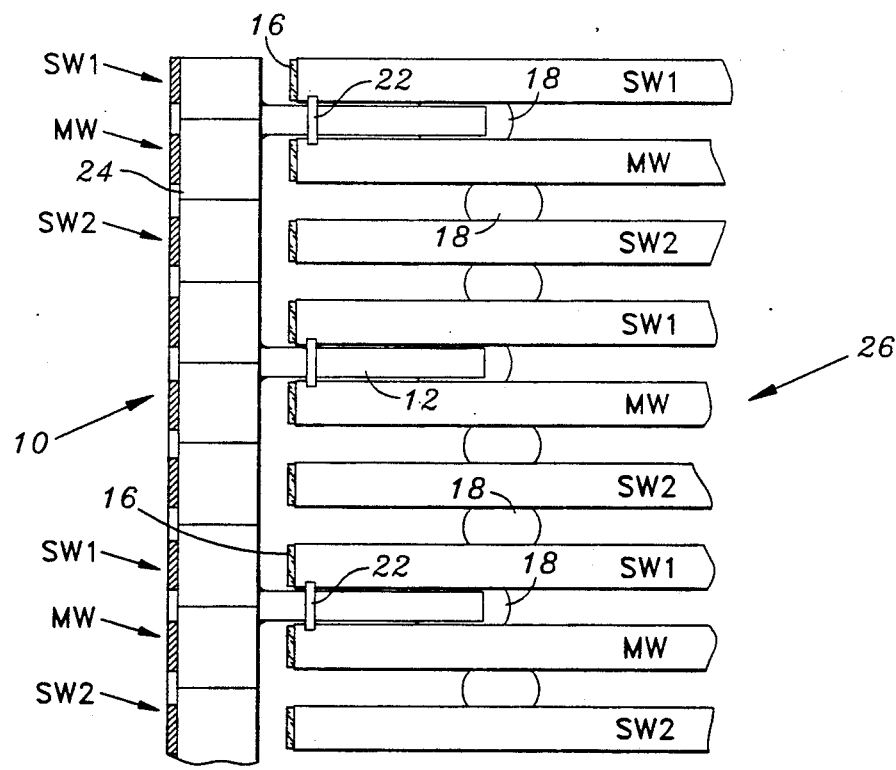
FIG. 10 is an enlarged side elevation view of the subassembly of a subarray with integral filter of FIG. 5.

Referring now to FIGS. 9 and 10, a subarray 26 is formed having supports 12 disposed between several pairs of adjacent modules 14 such that the supports 12 extend therefrom and form a common plane for the attachment of an integral filter 10. Conformal shims are disposed intermediate adjacent modules 14. The conformal shim material may also be used to bond the filter plate 10 to the support 12 of the subarray 26. Those skilled in the art will recognize that various adhesives are likewise suitable. Optionally, interlayer bonds 22 may be formed utilizing the conformal shim 18 material and/or another bonding material.

As in FIG. 1, SW1 SW2 and MW of FIG. 10 designate modules that output signals representative of different portions of the infrared spectrum. The portion of the infrared spectrum to which the detectors of a given module are sensitive is determined by the filter 10. The detectors are sensitive to, i.e. provide as output which represents, that portion of the infrared spectrum transmitted by their corresponding filters.

It is understood that the exemplary infrared detector subarray having an integral optical filter of the present invention described herein and shown in the drawings represents only a presently preferred embodiment thereof. Indeed, various modifications and additions may be made to such embodiment without departing from the spirit and scope of the invention. For example, the subarray need not be limited to the shape or configuration illustrated, but rather other shapes and configurations, i.e. cylindrical, hexagonal prism, may be suitable. Likewise, the order of the different frequencies (MW, SW1, SW2) may also differ (MW/SW) and vary (all MW, all SW, etc.) various filter shapes and configurations are contemplated. Thus, these and other modifications and additions may be obvious to those skilled in the art and may be implemented to adapt the present invention for use in a variety of different applications.

What is claimed is:

1. An infrared detector focal plane subarray having an integral optical filter assembly, said infrared detector focal lane subarray comprising:
   (a) a plurality of linear array detector modules bonded together in a vertical stack, each linear array detector module having at least one row of detector elements formed thereon;
   (b) a filter plate for transmitting infrared radiation of desired frequencies, said filter plate sized and configured to correspond to said infrared detector focal plane subarray; and
   (c) a plurality of supports disposed intermediate said filter plate and said infrared detector focal plane subarray, said supports attaching said filter plate directly to said subarray such that said filter plate is substantially parallel to and in close proximity to said infrared detector focal plane subarray, said supports disposed intermediate adjacent linear array detector modules such that the spacing of said modules is unaffected thereby and positioning of an image upon said infrared detector focal plane subarray is unaffected during toggling;
   (d) wherein a plurality of infrared detector focal plane subarrays may be assembled into a focal plane array upon which an image may be positioned, and the filter plates attached to said infrared detector focal plane subarrays eliminate the requirement for a large diameter focal plane filter.

2. The assembly as recited in claim 1 wherein:
   (a) said supports comprise planar members having a thickness of less than approximately 0.008 cm; and
   (b) said filter plate has a thickness of less than approximately 0.256 cm.

3. The assembly as recited in claim 1 wherein said filter plate further comprises first portions and second portions, said first portions being formed to transmit infrared radiation of a different frequency than that transmitted by said second portions.

4. The assembly recited in claim 3 wherein said first portions and second portions are substantially rectangular in shape and are disposed in an alternating pattern.

5. The assembly as recited in claim 3 wherein said first portions and second portions are formed as stripes and are disposed in an alternating pattern.

6. The assembly as recited in claim 1 wherein said filter plate comprises a periodically repeating pattern of a plurality of filter portions formed to transmit infrared radiation at a corresponding plurality of different frequencies and configured such that an image is toggleable among selected ones of said filter portions to facilitate detection of infrared radiation at a desired one of said plurality of different frequencies.

7. The assembly as recited in claim 6 wherein said filter plate comprises a periodically reappearing pattern of three different filter portions formed to transmit infrared radiation at three different frequencies configured such that an image is toggleable among selected ones of said three filter portions to facilitate detection of infrared radiation at a desired one of said three different frequencies.

8. The assembly as recited in claim 1 wherein said filter plate covers an area approximately equal in size to the area of the detector elements of said infrared detector focal plane subarray.

9. The assembly as recited in claim 1 wherein a support is disposed intermediate every third linear detector array module.

10. An infrared detector focal plane subarray having an integral optical filter assembly, said infrared detector subarray comprising:
   (a) a plurality of linear array infrared detector modules;
   (b) a filter plate disposed adjacent said modules sized and configured to correspond to said infrared detector focal plane subarray, said filter plate further comprising a plurality of parallel stripes, each parallel stripe transmitting infrared radiation of a different frequency than that transmitted by adjacent stripes; and
   (c) a plurality of planar supports adhesively bonded perpendicular to said filter plate, said supports received intermediate adjacent modules and sized to fit intermediate adjacent modules such that the desired spacing of adjacent modules is maintained;
   (d) wherein said filter plate is positioned parallel to and proximate to said infrared detector focal plane subarray to minimize scattering and crosstalk; and
   (e) wherein said parallel stripes are aligned relative to said infrared detector focal plane subarray such that each module in the subarray will receive infrared radiation of a desired frequency.

11. An infrared detector focal plane subarray having an integral optical filter assembly, said infrared detector focal plane subarray comprising:
   (a) plurality of stacked linear array infrared detector modules defining said infrared detector focal plane subarray;
   (b) a filter plate sized and configured to correspond to said infrared detector focal plane subarray;
   (c) a plurality of supports, disposed intermediate said filter plate and said infrared detector focal plane subarray, received intermediate adjacent modules and sized and configured such that the spacing of said modules is unaffected thereby, for attaching said filter plate to said infrared detector focal plane subarray such that said filter plate is parallel to and in close proximity to said infrared detector focal plane subarray;
   (d) wherein scattering and crosstalk are minimized by the positioning of said filter plate in close proximity to said infrared detector focal plane subarray; and
   (e) wherein a plurality of infrared detector focal plane subarrays may be assembled into a focal plane array and said filter plates eliminate the requirement for a large diameter focal plane filter.

12. The assembly as recited in claim 11 further comprising
   at least one conformal shim disposed intermediate adjacent modules to attach adjacent modules together at a desired distance from each other.

13. The assembly as recited in claim 12 wherein said filter plate further comprises a plurality of separate portions, each separate portion transmitting infrared radiation of a different frequency than that transmitted by adjacent portions such that said infrared detector focal plane subarray is sensitive to a plurality of different portions of the infrared spectrum.

14. A method for fabricating an infrared detector focal plane subarray having an integral filter, said method comprising the steps of:
   (a) attaching a plurality of supports to a plurality of linear array infrared detector modules such that said supports:
      (i) extend beyond said modules such that they may be used to attach a filter plate in front of said modules; and
      (ii) will be disposed intermediate adjacent modules when said modules are stacked such that said supports will be captured therebetween and such that the spacing of said modules is unaffected;
   (b) stacking said modules such that said supports may be used to attach a filter plate in front of said modules; and
   (c) attaching a filter plate to said supports such that said filter plate filters infrared radiation incident upon said detector subarray.

15. The method as recited in claim 14 wherein the step of stacking modules comprises:
   (a) applying at least on conformal shim to the upper surface of a plurality of adjacent modules;
   (b) compressing said modules together until they are separated by a desired distance; and
   (c) maintaining the desired distance until the conformal shims have substantially cured.

16. The method as recited in claim 14 wherein the step of attaching a plurality of supports to a plurality of said modules further comprises attaching a planar support having a flat edge to a plurality of modules such that when said modules are stacked the flat edges of said supports define a common plane.

* * * * *

UNITED STATES PATENT AND TRADEMARK OFFICE
CERTIFICATE OF CORRECTION

PATENT NO. : 5,138,164
DATED : August 11, 1992
INVENTOR(S) : Wei H. Koh

It is certified that error appears in the above-indentified patent and that said Letters Patent is hereby corrected as shown below:

Column 2, line 19, delete "mm", insert therefor --µm--.

Column 2, line 20, delete "mm", insert therefor --µm--.

Column 2, line 22, after "inches", insert -- ) --.

Column 2, line 22, after "side", insert --)--.

Column 7, line 61, after "SW1", insert --,--.

Column 9, line 4, delete "reappearing", insert therefor --repeating--.

Column 9, line 45, before "plurality", insert --a--.

Column 10, line 43, after "stacking", insert --said--.

Column 10, line 44, delete "on", insert therefor --one--.

Signed and Sealed this

Fifteenth Day of February, 1994

Attest:

BRUCE LEHMAN

*Attesting Officer*     *Commissioner of Patents and Trademarks*